United States Patent [19]

Gheewala

[11] Patent Number: 5,065,090

[45] Date of Patent: * Nov. 12, 1991

[54] METHOD FOR TESTING INTEGRATED CIRCUITS HAVING A GRID-BASED, "CROSS-CHECK" TEST STRUCTURE

[75] Inventor: Tushar R. Gheewala, Cupertino, Calif.

[73] Assignee: Cross-Check Technology, Inc., San Jose, Calif.

[*] Notice: The portion of the term of this patent subsequent to Jun. 7, 2005 has been disclaimed.

[21] Appl. No.: 218,724

[22] Filed: Jul. 13, 1988

[51] Int. Cl.⁵ .................. G01R 31/00; G01R 31/02
[52] U.S. Cl. .................. 324/158 R; 324/73.1; 371/15.1; 371/25.1
[58] Field of Search .......... 324/73 R, 73 PC, 73 AT, 324/158 R, 73.1; 371/15, 16, 25, 21

[56] References Cited

U.S. PATENT DOCUMENTS

| | | | |
|---|---|---|---|
| 3,168,697 | 2/1965 | Humphrey, Jr. | 324/73 |
| 3,428,945 | 2/1969 | Toy | 371/25 |
| 3,795,859 | 3/1974 | Benante et al. | 371/21 |
| 3,806,891 | 4/1974 | Eichelberger et al. | 340/172.5 |
| 4,253,059 | 2/1981 | Bell et al. | 324/73 |
| 4,293,919 | 10/1981 | Dasgupta et al. | |
| 4,340,857 | 7/1982 | Fasang | |
| 4,423,509 | 12/1983 | Feissel | 371/25 |
| 4,435,805 | 3/1984 | Hsieh et al. | 371/15 |
| 4,471,302 | 9/1984 | Fazekas et al. | 371/15 |
| 4,498,172 | 2/1985 | Bhavsar | 371/15 |
| 4,513,418 | 4/1985 | Bardell, Jr. et al. | |
| 4,517,672 | 5/1985 | Pfleiderer et al. | 371/25 |
| 4,595,875 | 6/1986 | Chan et al. | 324/73 PC |
| 4,613,970 | 9/1986 | Masuda et al. | 371/15 |
| 4,638,246 | 1/1987 | Blank et al. | 324/73 R |
| 4,672,610 | 6/1987 | Salick | 371/25 |
| 4,739,250 | 4/1988 | Tanizawa | |
| 4,749,947 | 6/1988 | Gheewala | 371/15 |

FOREIGN PATENT DOCUMENTS

| | | |
|---|---|---|
| 0151694 | 10/1984 | European Pat. Off. |
| 0174236 | 8/1985 | European Pat. Off. |
| 0223714 | 11/1986 | European Pat. Off. |
| 1128034 | 4/1962 | Fed. Rep. of Germany .... 324/73 R |
| 3207060 | 9/1983 | France ................................. 371/15 |
| 0032678 | 3/1978 | Japan ................................... 29/574 |
| 0000144 | 1/1983 | Japan ................................... 29/574 |
| 0205870 | 11/1983 | Japan ............................. 324/73 R |
| 0059599 | 4/1985 | Japan ................................... 371/21 |
| 8202096 | 6/1982 | PCT Int'l Appl. ............... 324/73 R |
| 0585458 | 12/1977 | U.S.S.R. .......................... 324/73 R |

OTHER PUBLICATIONS

"Kerf Testing of Embedded Structure Technologies", by Kugler et al., IBM Tech. Disc. Bull., vol. 23, #8, 1/81, pp. 3716–3719.

"Module-in-Place Testing Autoguided Probe Isolation and Diagnostic Technique", by Jackson et al., IBM Tech. Disc. Bull., vol. 23, #9, 2/81, pp. 4078–4079.

(List continued on next page.)

Primary Examiner—Kenneth A. Wieder
Assistant Examiner—William J. Burns
Attorney, Agent, or Firm—Townsend and Townsend

[57] ABSTRACT

A new test structure is described which allows full testing of highly complex Integrated Circuits. The test structure consists of a grid of externally as well as individually accessible probe-lines and sense-lines with electronic switches at the crossings of said probe and the sense-lines. One end of the switches is tied to an array of test-points on the IC that are to be either monitored or controlled during the testing, and the other end of the switches is tied to a sense-line. The ON and the OFF states of the switches are controlled by probe-lines. The probe and sense lines are connected to test electronics, thus permitting the test electronics to control the electrical signals on the probe-lines and to measure or apply signals on the sense-lines. Thus, by the excitation of an appropriate probe-line and the monitoring of an appropriate sense-line, the test signals present at any one of the test-points can be measured. Conversely, by the excitation of an appropriate probe-line and application of a test signal on another appropriate sense-line the electrical signal on any of the test-points can be externally controlled for the purpose of testing.

3 Claims, 10 Drawing Sheets

OTHER PUBLICATIONS

"Universal Test Sets for Multiple Fault Detection in ANO-EXOR Arrays", by Prodban, *IEEE Trans. on Comp.*, vol. C-27, #2, 2/78, pp. 181–187.

"Voltage Checking Device", by Canard et al., *IBM Tech. Disc. Bull.*, vol. 8, #5, 10/65, pp. 806–807.

Frank, E. H. and Sproull, R. F., "Testing and Debugging ICs", *Computing Surveys*, vol. 13, No. 4, Dec. 1981.

T. W. Williams, "Design for Testability", 1983.

McCluskey, Edward J., Stanford Univ., "Built-In Self-Test Techniques", *IEEE Design & Test*, vol. 2, #2, Apr. 1985, pp. 21–28, 29–36, copyright 1985.

Williams, T. W., "Design for Testability", *IBM Data Systems Division*, Boulder, Colorado, pp. 359–416.

Eichelberger, E. G. & Williams, T. W., "A Logic Design Structure for LSI Testability", IBM System Communications Division, Hopewell Junction, NY, 12533 & IBM System Products Division, Boulder, CO, 80303, pp. 462–468.

Hayers, J. P. & Friedman, A. D., "Test Point Placement to Simplify Fault Detection", Dept. of Electrical Engineering & Computer Science Program, Univ. of Southern California, Los Angeles, CA, 90007, pp. 73–78.

*IBM Technical Disclosure Bulletin*, vol. 18, No. 7, Dec. 1975, "Test Pad Multiplexing", D. K. Jadus and W. O. Morton.

*IEEE Journal of Solid-State Circuits*, vol. SC-21, No. 2, Apr. 1986, "A One-Day Chip: An Innovative IC Construction Approach Using Electrically Reconfigurable Logic VLSI with On-Chip Programmable Interconnections", Y. Ikawa et al.

IEE Proceedings Section A-I, vol. 132, No. 2, Part E, Mar./Apr. 1985, pp. 121–129, Old Woking, Surrey, GB; K. A. E. Totton: "Review of Built-In Test Methodologies for Gate Arrays".

METHOD FOR TESTING INTEGRATED CIRCUITS HAVING A GRID-BASED, "CROSS-CHECK" TEST STRUCTURE

This application is based on the inventor's U.S. Pat. No. 4,749,947 issued June 7, 1988.

BACKGROUND OF THE INVENTION

1. Field of the Invention

This invention relates to a novel structure to aid in the testing of high-density electronic systems such as Integrated Circuit (IC) chips.

2. Description of the Prior Art

The advanced semiconductor technology with its ability to integrate a large number of electronic circuits on a single Integrated Circuit (IC) has brought down the cost of functions, such as computers, by many orders of magnitude. The resulting reduction in size, weight and number of interconnections have also improved the reliability and portability of the electronic systems. However, the higher number of circuits within an IC has created one big problem-how to test the IC to verify that it will perform according to the specifications under all circumstances and if it does not perform according to the specifications then how to determine what is exactly the nature of the fault?

The testing of a complex IC requires that a large number of test-points be available on the IC to control and to observe the states of all the circuits within it. The test-points are defined as the electrical nodes on the Integrated Circuit which are accessible to test-electronics external to said Integrated Circuit for the purpose of either measuring the signals present at said electrical nodes or injecting a signal at said electrical node. The cost of adding more test-points within an IC is that the test-points, which are generally contacted by mechanical means, occupy a lot of area-causing the IC to be significantly larger and hence more expensive and slow. The locations on the IC where external test electronics can be electrically connected to the IC are referred to as probe-points. Various test structures have evolved over the past few years to increase the number of test-points on an IC while minimizing the area occupied by the probe-points. These techniques are described below.

The most common test structure is based on the use of signal input and output pads on an IC. These input and output (also called I/O) pads are provided on every IC so that it can communicate with the eternal world and they are called the primary input and output pads. In the commonly used test techniques, different test patterns are presented to the primary input pads of the IC and the signals on the primary output pads of the IC are observed to verify that the IC chip functions correctly under all test situations.

In many instances the primary inputs and outputs do not provide adequate controllability or observability over the circuits within the IC to test it completely. Sometimes, additional test-points are added to the IC and brought out to additional probe-points where they may be connected to external test electronics by the means of mechanical probes. An article entitled "Test Point Placement to Simplify Fault Detection" by J. P. Hayes et al. in IEEE 1973 Symposium on Fault Tolerant Computing (FTC-3), p. 37, shows a method for additional test-points placement to improve testability of an Integrated Circuit. This reference, however, does not show a structure for a multi-dimensional, easily accessible array of test-points as disclosed in the present invention. The above schemes becomes impractical when the number of circuits within the IC becomes greater than a few thousands. In such cases the so-called "SCAN-TEST" (Ref. T. W. Williams and K. P. Parker, "Design for Testability—A Survey" Proc. IEEE, VOL. 71, pp. 98-112, Jan. 1983) or the so-called "Level Sensitive Scan Design" (Ref. E. B. Eichelberger and T. W. Williams, "A Logic Design Structure For LSI Testing", Proc. 14th Design Automation Conf., June 1977, 77CH1216-1C, pp. 462-468; also, E. J. McClusky, "Built-in Self-Test Techniques" and "Built-in Self-Test Structures" IEEE Design and Test, Vol. 2, No. 2, pp. 437-452, April 1985.) techniques are used. These techniques are based on the storage elements such as flipflop circuits within the IC, which are externally controlled to either generate a desired signal at a given test-point within the IC chip, or to observe a signal at a given test-point within the aforementioned IC. Additionally, these storage elements are serially connected together as shift-registers so that all said storage elements can be serially accessed by external electronics while requiring very few additional probe-points. Thus, these techniques succeed in introducing additional testpoints on the IC, in addition to those provided by the primary inputs and outputs pads on the IC chip. The major disadvantage of these techniques is that an areaconsuming and speed-degrading flip-flop circuit is needed for each additional test-point that is added to the IC.

U.S. Pat. Nos. 3,806,891; 3,761,675; 4,293,919 and 4,513,418 assigned to the IBM Corporation teach that the flip-flop circuits on the Integrated Circuit can be used as additional test-points and that they can be serially connected together as a shift-register to allow access to them through very few probe-points. These references can be distinguished from the present invention in that they provide a limited number of additional test-points, equal to the number of flip-flop storage elements used for test purposes and in that these additional test-points are connected together in only one dimension, forming a serial shift-register. The present invention does not demand space consuming flip-flop storage elements and the test-points are accessed in a two or more dimensional fashion to provide a significantly higher number of test-points on an IC than available in the techniques described in the above referenced patents.

U.S. Pat. No. 4,340,857 filed July 20, 1982 in the name of P. P. Fasang teaches the use of Linear Feedback Shift Registers (LFSR) for the purposes of test pattern generation as well as for test output data compaction and analysis. This reference does not show a multidimensional, grid-based test structure for providing increased number of test-points on the Integrated Circuit. U.S. Pat. No. 4,423,509 filed Dec. 27, 1983 in the name of N. H. Feissel shows yet another technique to use flip-flops as additional test-points on an Integrated Circuit. This reference can be distinguished over the present invention in that it produces only one additional test-point for each flip-flop employed and that it does not teach a multi-dimensional grid structure to generate a large number of test-points.

As the integration levels of the ICs increase to the 10,000 gates and above levels the test techniques referenced above become quite inadequate because they can not economically excite every possible signal combination and can not inquire the state of every circuit within the IC. Thus, serious danger exists that all the faults in an IC will not be found before the IC is employed in a product. The IC may later fail in a critical application, forcing large redesign costs, product withdrawals and creating the potential for very large liabilities.

Recently, several new test techniques have been proposed which seek to reduce the size of the probes-points to allow more test-points within an IC. These new techniques employ either electron beams or laser light beams to probe the test signal within the IC. The physical diameters of the laser or the electron beams can be made extremely small as compared to the mechanical probes used previously. Thus these techniques do not require large, area consuming probe-points. The availability of such beams removes the restrictions placed by the limited number of primary I/O pads on the IC. Most signal nodes can now be probed by these beam techniques. The cost of such techniques is however quite formidable since they require very sophisticated alignment and focussing systems, vacuum chambers and expensive laser or electron beam sources. Other disadvantages of these beam techniques are that it allows the control or the observation of only a few nodes on the IC at any one time and that it takes a very long time to test ICs.

The "Cross-check" test structure of the present invention solves the above problems by providing a large number of test-points for a detailed testing of an IC chip and yet does that while occupying very little area on the IC and does not require expensive equipments such as vacuum chambers and electron or laser beams. This is accomplished by employing a two or more dimensional array of test-points on the IC. Another distinguishing feature of the present invention over the prior techniques cited above is its ability to immediately pin-point the exact location of a fault without the need for lengthy calculation. This allows rapid debugging and verification of a new design.

SUMMARY OF THE INVENTION

The present invention is a new test structure which allows up to 100 percent electrical testing of Very Large Scale Integrated Circuits by the addition of an array of test-points in the Integrated Circuit (IC). According to the broadest aspects of the present invention, the test structure consists of a multi-dimensional array of externally accessible "probe-lines" and "sense-lines" with an electronic switch at each intersection of the probe-lines with the sense-lines. The probe-lines and the sense-lines are electrically connected to external text electronics by the means of probe-points. One end of each of the electronic switches is tied to a test-point on the IC where an electrical signal is to be either measured or controlled during test and the other end of the switch is tied to a said sense-line. The ON and the OFF states of the electronic switches are controlled by probe-lines. Thus, by applying signal levels on the probe-lines one at a time and by external monitoring of the signals present on the sense-lines, the electrical test signals at every intersections of the probe-lines and sense-lines can be measured. For example, a 100×100, 2-dimensional, array consisting of 100 probe-lines and 100 sense-lines would allow direct testing of up to 10,000 test-points on the IC, however, requiring only 200 additional probe-points which must be connected to external test electronics through mechanical probes. This number of external probe-points can however be further reduced by accessing the probe-lines and the sense-lines through dedicated on-chip test electronics consisting of serial/parallel shift-registers on the IC being tested. Thus, further reducing the external probe-point requirement to less than 10 as compared to the 200 probe-point requirement mentioned above. Besides being able to measure the absence or the presence of a signal at a test-point, this test structure also permits the measurement of analog parameters such as voltage amplitude and current sourcing and sinking capabilities of an electronic circuit. These analog measurements give a very good measure of the speed and the noise margins of the device under test.

It is the objective of this invention to improve the quality of Integrated Circuits by making it possible to test them thoroughly and in cases where the ICs fail the test, to pin-point the exact location of the failures and the conditions under which the failure occurs.

In accordance with still broader aspects of this invention, the 'sense-lines' and the 'probe-lines' form a 2 or 3 dimensional addressing scheme that can uniquely and individually address the various circuits that comprise the Integrated Circuit.

In accordance with yet broader aspects of the teaching of this invention, a laser or an electron beam is combined with either sense or probe-lines or both, as well as with appropriate electronic switches to control or to observe the test-points within an electronic system such as an IC.

In accordance with further teachings of this invention, the proposed 'cross-check' test structure can be combined with test electronics on the IC, said test electronics being capable of generating test patterns and also of measuring, storing and analysing the test signals. Existing on-chip test techniques such as "Level Sensitive Scan Design", "Scan-Test" or "Built In Logic Block Observation" etc. can be combined with the test structure of the present invention to provide improved test coverage over the prior test techniques.

In accordance with further teachings of the present invention, the aforementioned probe-lines and sense-lines can be used as power supply lines to the circuits under test to measure the currents flowing through them as a measure to determine if said circuits are functioning correctly.

In accordance with more specific aspects of the present invention, layouts of the sense and probe-lines on a semiconductor wafer are described that minimize the area required to probe them.

The foregoing and other objective, features and advantages of the present invention will become more clear from the detailed descriptions of the preferred embodiments of the invention, as illustrated in the accompanying figures.

DESCRIPTION OF THE PREFERRED EMBODIMENTS

Adequate testing of a high-density Integrated Circuit (IC) requires many test-points within the IC. A test-point refers to a location on the IC at which either a signal can be injected into a circuit or a signal can be monitored by external test electronics. Ideally, each test-point is associated with a probe-point-the probe-point being defined as a location on the IC at which external test equipment can be electrically connected to the IC, usually by the means of a very fine metal probe. These probe-points permit the test equipments to either inject known signals at the inputs to the different circuits within the IC or to observe the outputs of these different circuits under different test conditions. By repeating this process for each circuit within the IC, one can verify that each piece is performing as required and hence conclude that the entire IC will function as required. As the circuit density of Integrated Circuits continues to increase, the number of probe-points required becomes unacceptably large in that the area occupied by these probe-points account for a large share of the IC's cost and performance. Several techniques have been proposed to use a limited number of probe-points to access a larger number of test-points on the IC. These techniques can be grouped into two classes: (1) the inclusion of electonic memory elements such as flip-flops and shift-registers which are used as additional test-points on the IC while occupying less area than the conventional mechanical probe-points; (2) the use of very small sized beams of either laser light or electrons in place of the mechanical probes to reduce the area of the probe-points.

Figure 1:
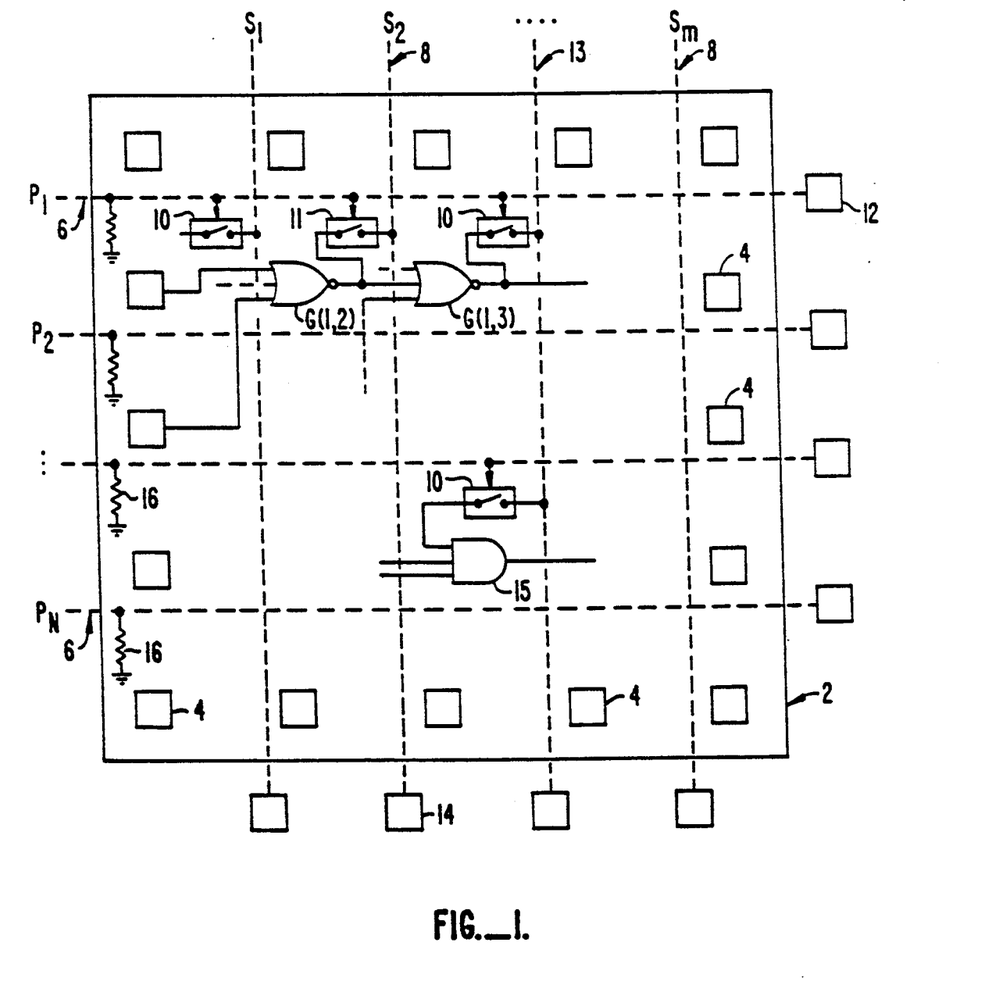
FIG. 1 is a schematic diagram of a "cross-check" test structure on an Integrated Circuit (IC) showing how probe-lines and sense-lines are combined with an electronic switch to observe the outputs of internal logic circuits such as G(1,2).

The present invention discloses a completely different and novel technique to maximize the number of test-points without sacrificing too much IC area, as illustrated in FIG. 1. A typical IC 2 is shown in FIG. 1 comprising of several different electronic circuits such as logic gates $G(1,2)$ and $G(1,3)$. The IC also has several primary Input and Output (I/O) pads 4 on the periphery of the chip which are used to carry signals and power supplies to and from the IC. These primary I/O pads have traditionally doubles as probe-points. However, with the increased circuit densities, it is no longer possible to adequately test all the circuits on the IC by simply relying on the primay I/O pads as probe-points.

The novel "Cross-check" test structure being described here and illustrated in FIG. 1 requires the addition of the following components to a traditional IC to improve its testability: probe-lines 6; sense-lines 8; electrical switches 10 at the intersection of the sense-lines and the probe-lines; and additional probe-points 14 and 12 connected to the probe-lines and the sense-lines respectively. The probe-points are large area pads on the IC which are used to connect external test electronics to the probe-lines and sense-lines and they may be located within or outside the IC. The probe-lines 6 are further connected to the control terminals of the electronic switches 10 and the sense-lines 8 are connected to one of the two switchable terminals of the electronic switches 10. The other switchable terminal of the electronic switches 10 are connected to test-points on the IC 2, the signal levels at which need to be either measured or controlled for the purpose of testing the IC.

The probe-lines 6 are arranged parallel to each other and orthoganal to the parallel set of sense-lines 8. The electronic switches 10 are arranged in a rectangular array. The probe-lines 6 are connected to the control terminals of the switches 10 in such a manner that any one probe-line can turn ON at most only one switch connected to any one sense-line.

With these additional components it is possible to control or observe many more test-points within the IC than possible previously. For example, by activiating the probe-line P1 the switch 11 is turned 'ON', i.e. it can transmit the signal present at its input terminal to its output terminal. Thus the signal at the output of circuit $G(1,2)$ is transmitted through switch 11 to sense-line S2 and can now be measured by test equipment connected to probe-point 14. The other probe-lines are maintained OFF during the above test procedure so that only one switch connected to a sense-line is ON at any one time. In the OFF state the electrical switches 10 and 11 disconnect the output nodes from the input nodes and present a high impedance path to the sense-lines. By appropriate choice of the probe and sense lines, any test-point connected to the electronic switches at the intersections of the probe-lines and the sense-lines can be monitored. Thus, for example, in an IC with N probe-lines and M sense-lines, a total of up to $N \times M$ test-points can be observed with the addition of only $N + M$ probe-points. Further, the sense-line 8 may be used either to observe the output of a circuit such as $G(1,2)$ or to control the input to a circuit such as $G(1,3)$ by overdriving the output of circuit $G(1,2)$. In some applications the electronic switches may be connected between sense-lines and inputs to the circuits to be tested. As shown in FIG. 1, such an arrangement permits direct application of control signals from the sense-line 13 to the input of the circuit 15 under test by selecting an appropriate sense-line. In such an application the sense-line 13 can also be referred to as a control-line.

Optional resistors 16 are connected between the probe-lines and a reference voltage level in FIG. 1 to automatically turn the switches such as 10 OFF during the normal operation of the IC. Similar resistors can also be connected between the sense-lines and voltage sources to assure that no test signals are applied to the Integrated Circuits during their normal operation.

Figure 2:
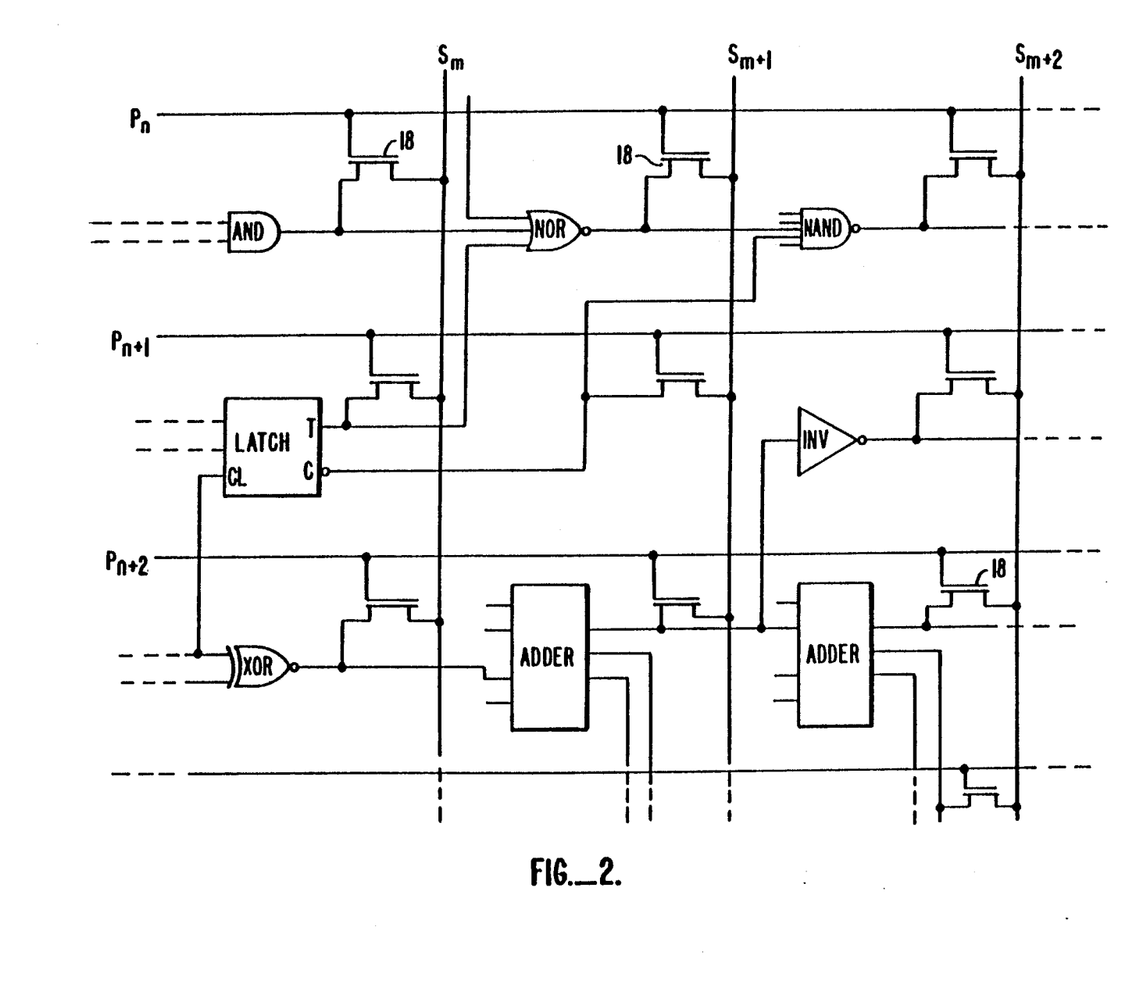
FIG. 2 is a detailed schematic drawing of a section of an IC containing the "Cross-check" test structure showing how three probe-lines and three sense-lines are used to test 9 different test-points on the IC.

A more detailed example of the "Cross-check" test structure is shown in FIG. 2. A section of a large IC containing 3 each probe-lines (Pn, Pn+1, and Pn+2) and sense-lines (Sm, Sm+1, and Sm+2) is shown. Eight electronic circuit elements such as AND, NOR, NAND, ADDER etc. are included within this section of the IC. The outputs of these circuits are routed to the sense-lines by the means of MOSFET (Metal Oxide Semiconductor Field Effect Transistor) switching devices 18. The MOSFET switches 18 are controlled by the probe-lines. For example, a 'HIGH' signal on the probe-line Pn would turn the MOSFET switches controlled by Pn ON and in turn transmit the signals on the outputs of the AND, NOR and NAND gates to the sense-lines Sn, Sn+1, and Sn+2 respectively. Thus by activating all three probe-lines, one at a time, the nine electrical signals present at the intersections of the probe and the sense-lines can be measured at the three sense-lines. The circuits are next tested for a different set of input signal patterns, the new pattern being generated either on the IC, or applied by external test electronics to the IC, or both. This process is repeated until all the circuits on the IC are tested under all the input signal patterns necessary to prove their correct functionality. Since the "cross-check" technique allows the measurement of the input signals to the circuit as well as the output signals, it is easy to determine when all the necessary test patterns have been applied to the inputs of the circuits under test. Similarly, when an incorrect signal is measured on the sense-lines, the location of the error is immediately known by finding the device at the intersection of the error containing sense-line and the active probe-line.

Figure 3A:
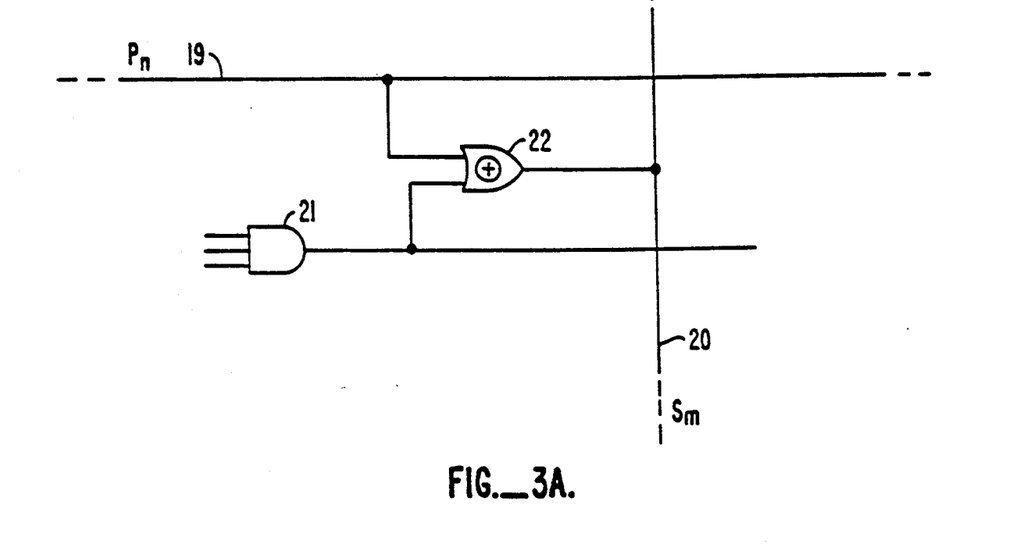
FIG. 3a illustrates an alternate "cross-check" scheme where the signal to be tested is routed to the sense-lines by a logic gate rather than through an electronic switch.

Although a switch has been used to control the transfer of signals from a test-point to the sense-line, other switchable devices such as AND, OR, XOR, NOR etc. logic gates may also be used in place of the switches 10 in FIG. 1 or switches 18 in FIG. 2. An example of this approach is illustrated in FIG. 3a. The output of the circuit under test 21 is transferred to the sense-line 20 by the means of an Exclusive-OR logic gate 22. The logic gate 22 is controlled by probe-line 19. In this application, the logic gate 22 must present a high impedance to the output node during its OFF state to allow the connection of multiple outputs to a single sense-line.

Figure 3B:
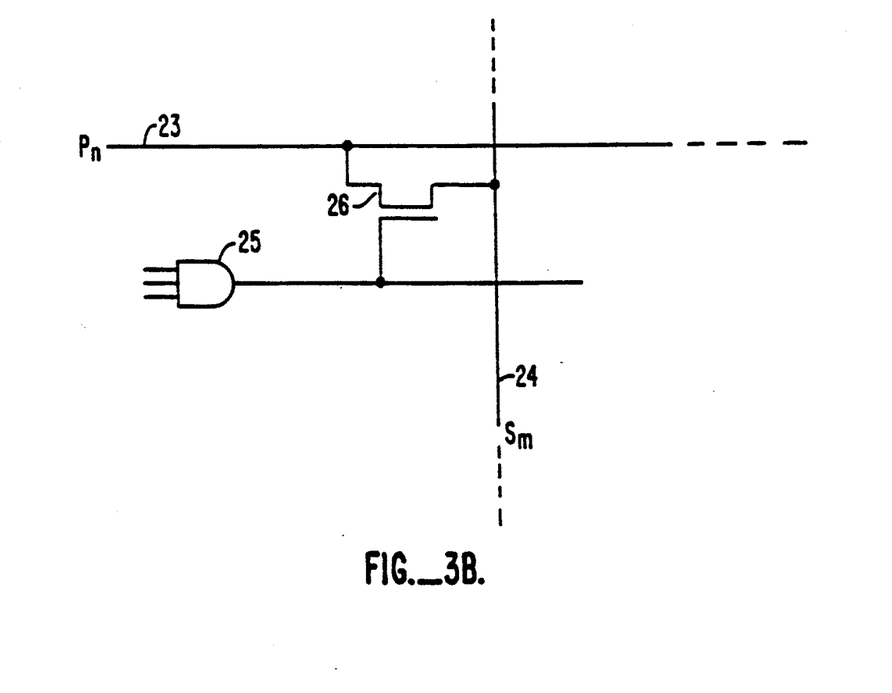
FIG. 3b illustrates an alternate 'cross-check' test structure arrangement where the signal at a test-point is used as a control input to the electronic switch.

The electronic switches may be made of MOSFET devices as described in FIG. 2, or from other electrical switching devices such as a Bipolar Junction Transistors, Metal Semiconductor Field Effect transistors (MESFET), Josephson Junctions, or Gallium Arsenide devices. The electronic switching devices may be arranged in varying configurations, as illustrated in FIG. 3b. In this illustration, the output of the circuit under test 25 acts as a control input to the switch 26. A high signal is measured on the sense-line 24 only when the probe-line 23 and the output of circuit 25 are both 'ON'. The advantage of such a scheme would be to reduce the loading on the circuit under test.

Although the probe-lines and the sense-lines are arranged to be parallel to themselves and orthogonal to each other in the above discussions, they can in general be any irregular array of signal lines that cross in a large number of points, each crossing can then be turned into a test-point by inserting a switch there in the manner described above. Further, the input signal to the switch need not be associated only with the output of an electronic circuit, in fact, it can be any signal of interest, including the primary input and output signals, clock signals and power supply levels at different locations on the IC. Similarly, in a general scheme of testing based on the "cross-check" technique described above, various other options are available such as the use of laser or electron beams to measure the signals on the sense-lines or to control the signals on the probe-lines.

Figure 4:
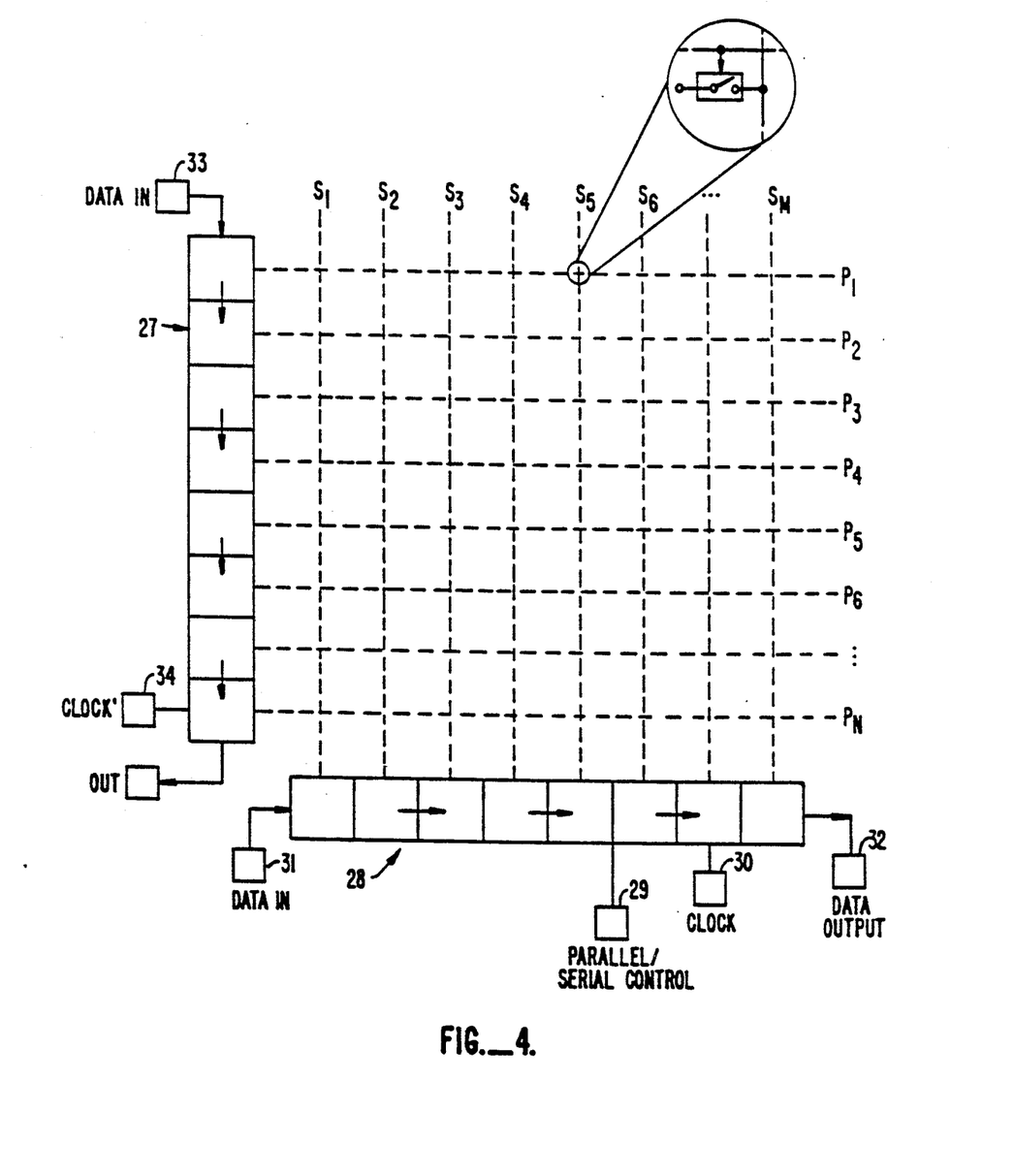
FIG. 4 integrates electronic shift-registers with the probe-lines and sense-lines to reduce the number of probe-points required to control the probe-lines and to observe the outputs of the sense-lines.

It is possible to reduce the number of probe-points required to excite the probe-lines and to observe the sense-lines, by including on-chip test electronics on the IC being tested. A preferred approach to on-chip test electronics is to store the information corresponding to the probe-lines and sense-lines in shift-registers on the IC being tested, as shown in FIG. 4. The outputs of the shift-register 27 control the probe-lines P1 through PN and are designed to activate only one probe-line at a time during testing. When a specific probe-line is activated, the electrical signals on the test-points connected to the switches controlled by that specific probe-line are transferred to the sense-lines S1 through SM. The signals present on the sense-line are next stored in shift-register 28 connected to the sense-lines. This is achieved by applying an external control signal to the parallel/serial control 29 to put the shift-register 28 in the parallel mode and turning the clock 30 ON once. The signals on the sense-lines are now stored in the sense shift-registers 28. Next, the signals stored in the shift-register 28 can be serially read out at probe-point 32 for analysis by external test electronics. This is achieved by applying an external signal to the parallel/serial control probe-point 29 to put the shift-register 28 in a serial mode and turning the clock 30 ON and OFF M times. Similarly, the control data in the probe-line shift-register 27 can be loaded from external test electronics in by presenting the data in a serial manner at the input probe-point 33 and by turning the clock 34 ON and OFF N times. The input and output terminals of the shift-registers can be series connected with those of other ICs to allow simultaneous testing of multiple ICs in a large system. A comparator circuit may be inserted between the output of the sense-lines and the input to the shift-register 28 to measure the amplitudes of the signals present on the sense-lines.

The use of on-chip shift-registers to store the data permits the number of probe-points to be reduced from a total of N+M to about 6. In fact, a further reduction in the number of probe-points necessary to implement the "cross-check" technique can be achieved by replacing the shift-register 27 controlling the probe-lines by an on-chip circuit such as a counter that during testing would activate the probe-lines one at a time in an orderly manner without the need for external data entry.

In the normal operating mode of the Integrated Circuit, all the probe-lines P1 through PN are maintained in the deselect mode, so that the sense-lines are disconnected from the test-points that are monitored during test.

The use of on-chip shift-registers described above will slow down the speed of testing since the output data can be measured only one bit at a time as compared to being able to measure all the sense-line outputs at once. A reasonable compromise between the need to improve the test speed and the need to reduce the number of probe-points can be achieved by the use of several output terminals in addition to 32 on the shift-register 28.

In some cases both the sense-line and the shift-register outputs can be brought out to probe-points to allow direct probing of the sense-lines at the wafer level and only the shift-register probing for later testing when the IC is packaged.

Figure 5:
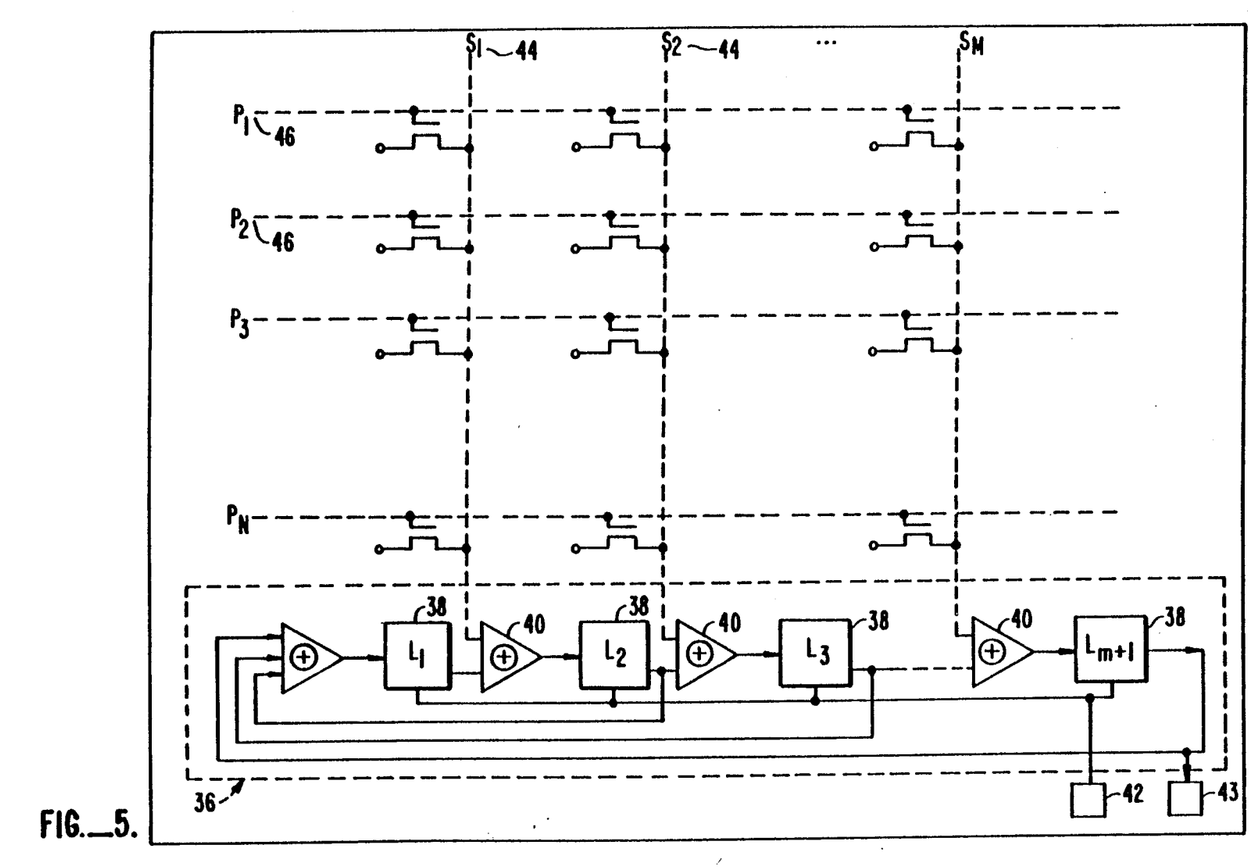
FIG. 5 integrates a Linear Feedback Shift Register (LFSR) with sense-lines on the IC to compact the test data on the sense-lines with the data previously stored in the LFSR and to generate a parallel signature.

Further improvements in the speed of testing can be achieved by performing analysis and compaction of the sense-line data on the IC itself, without the need for sending the data to the external test equipment. In such a case, the sense-lines output data does not need to be read out every time a new data appears on the sense-lines. One example of an on-chip data compaction technique is shown in FIG. 5. The signals to be measured on the sense-lines are fed into a Linear Feedback Shift-Register (LFSR) 36. Detailed description of data compaction techniques such as the one based on LFSR can be found in the following references: 1. N. Benowitz et al., "An Advanced Fault Isolation System For Digital Logic," IEEE Trans. Computers, VOL.C-24, No. 5, May 1975, pp. 613–620; 2. E. J. McClusky, "Built-in Self-test Techniques", IEEE Design and Test, VOL. 2, No. 2, April 1985, pp. 437–444.

The LFSR shown in FIG. 5 is made up of data storage latches 38 and Exclusive-OR gates 40. When the CLOCK 42 is turned 'ON', the output signals of the latches are Exclusive-ORed with the data present on the sense-lines 44. The outputs of the Exclusive-OR gates are stored in the following latches on the LFSR. The LFSR has a special property that it retains a signature of the past data stored in the shift-registers while it is compacted with the new data input from the sense-lines 44. Thus the sense data can be compacted in the LFSR and then read out only occasionally at the output probe-point 43. The data read out from the LFSR will carry a signature of the past data on the sense-lines and would therefore in most cases indicate if an error was detected on the sense-lines. For example, the data in the LFSR can be read out once following each cycle of testing in which all the probe-lines 46 have been excited once for a fixed input test pattern. Thus, if the test structure consists of N probe-lines, the data in the LFSR will need to be read out only once in N cycles. After the data has been read out, the input test pattern to the IC is changed and all the N probe-lines are activated once again, one at a time, without the need to read out the sense-line outputs after each probe-line activation. This procedure reduces the amount of data read by the external test electronics by a factor of N. Several other well-known techniques can also be employed to compact the sense-line data on the IC such as, counting 1's or parity techniques. Both the LFSR and the sense-lines signals may be connected to external test equipment by the means of probe-points to allow more detailed testing.

In contrast to the previously known test structures, the "cross-check" technique of this invention described herein above provides a significantly larger number of test-points on the IC by using a 2-dimensional addressing structure. The probe-lines form one dimension and the sense-lines form the other. This 2-dimensional scheme produces number of test points which are the multiple of the number of lines, e.g. $N \times M$, rather than just $N+M$, wher N and M are the number of the probe-lines and the sense-lines respectively. Similarly, a three dimensional structure can be used when testing three dimensional ICs or three dimensional packaging of multiple ICs. Such a three dimensional test structure consisting of 100 lines in each of the three dimensions would produce 1,000,000 test points!

Figure 6:
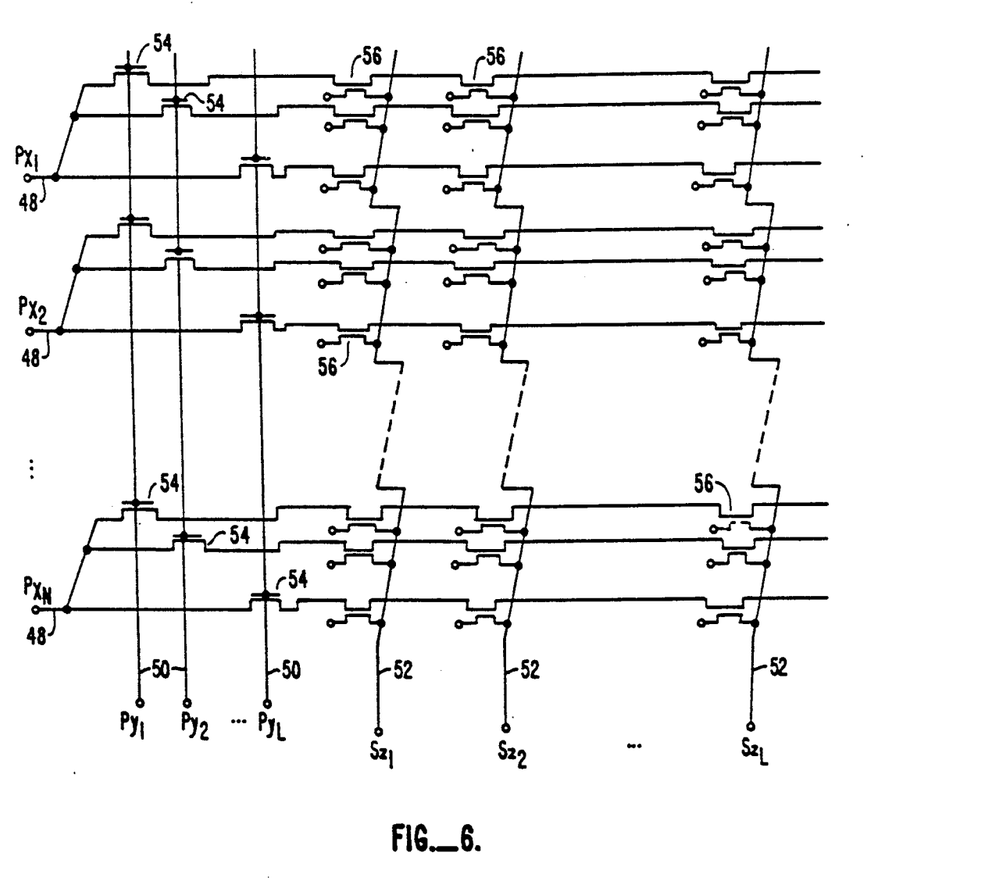
FIG. 6 illustrates a three dimensional implementation of the cross-check test structure.

An example of a 3-dimensional "cross-check" structure is illustrated in FIG. 6, consisting of three sets of special signal lines. They are Px and Py, the probe-lines and Sz, the sense-lines. The Px probe lines 48 and the Py probe-lines 50 are used to generate a 2-dimensional addressing grid (sized $N \times L$) by the means of switches 54. The outputs of this 2-dimensional address grid are used to control a three dimensional array of electronic switches 56. One switching terminal of the switches 56 is connected to electrical test-points on the electronic device and the other terminal of the switches 56 is tied to an array of sense-lines 52. By appropriate choice of a probe-line from the Px array 48, another probe-line from the Py array 50 and a sense-line from the Sz array 52, any one of the $N \times M \times L$ array of test-points on the electronic device can be tested. As described before, test electronics internal to the electronic device under test can be combined with the probe-lines and the sense-lines on a 3 dimensional test structure to minimize the number of probe-points and to speed up testing.

Figure 7:
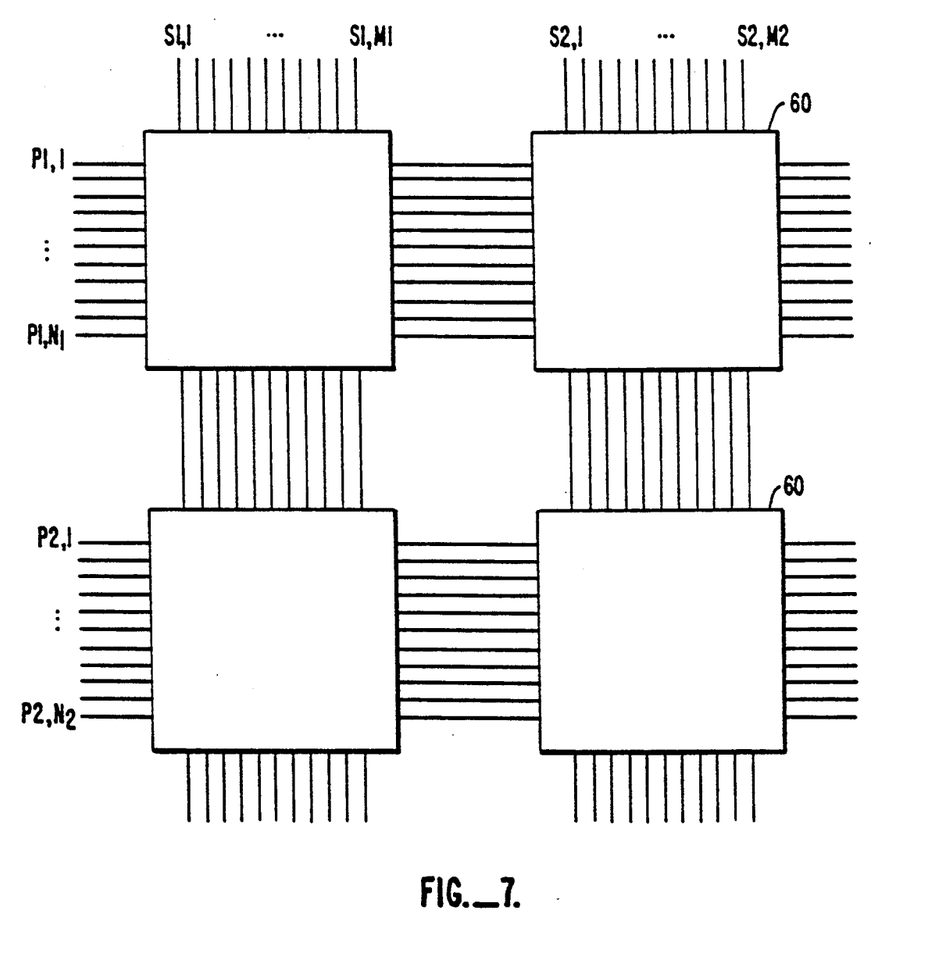
FIG. 7 illustrates how the cross-check test structure can be extended to test an array of electronic devices while sharing the probe-lines and sense-lines between them.

The "cross-check" test structure can also be extended in the 2-dimensions to test multiple electronic components on a wafer or on a package, as shown in FIG. 7. In this case the probe-lines P1,1 thorugh P2,N2 and the sense-lines S1,1 through S2,M2 are shared between electronic components such as ICs 60. The electronic components 60 may be of different sizes in either of the two dimensions. As mentioned earlier, the on-chip probe and sense shift-registers of several different ICs can also be cascaded to test a large system consisting of several ICs.

Figure 8A:
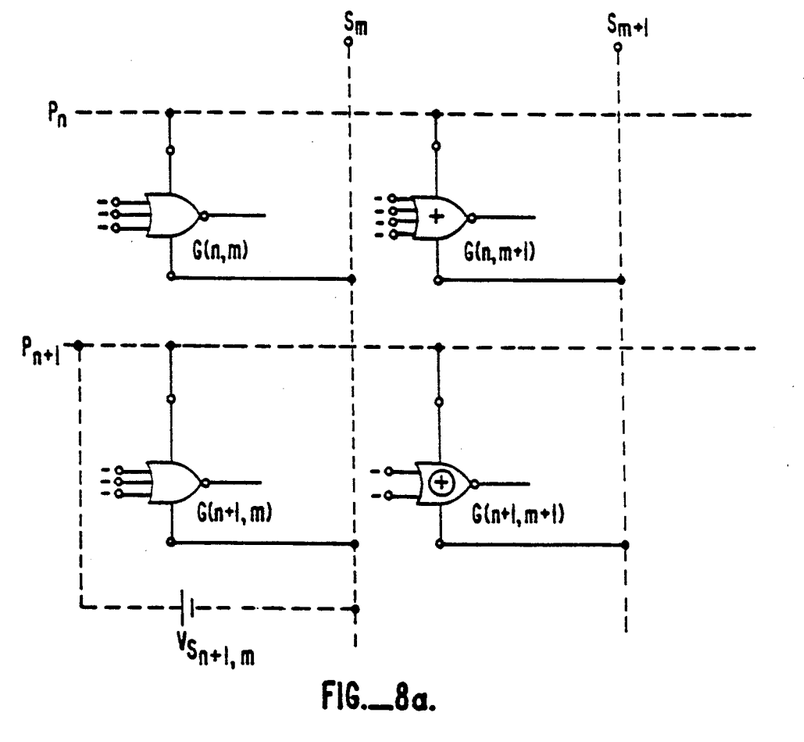
FIG. 8a is a specific implementation of the cross-check test structure where the probe and sense lines are configured as externally and individually accessible power supply and power return lines to measure the current flowing through the circuit under test.
Figure 8B:
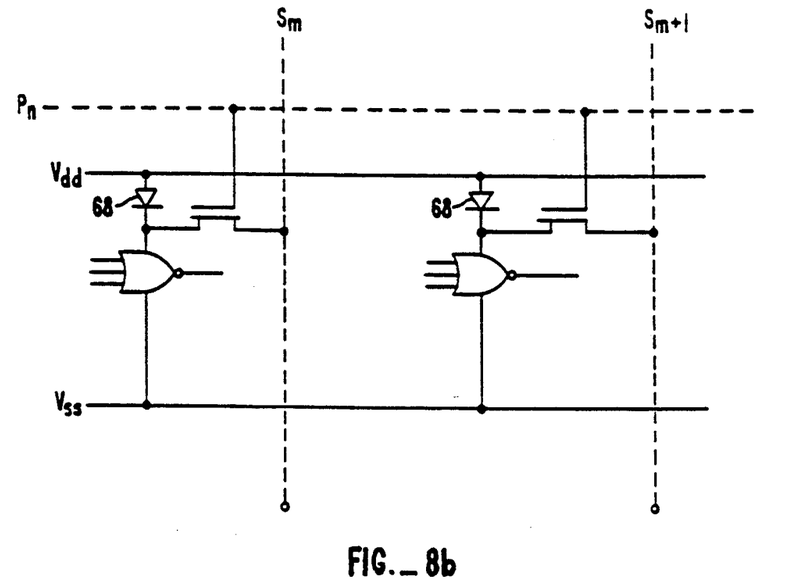
FIG. 8b illustrates a test structure where only the sense-lines are used as power supply lines and the probe-lines are used to control the switches that connect the sense-lines to the circuit under test. It also shows an additional diode in series with the power supply to eliminate the possibility of current flow through an alternate path that may by-pass the circuit under test.

In certain applications the "cross-check" test structure of the present invention can be used to measure the power supply currents flowing through the circuits within the IC. In this case the probe-lines and the sense-lines are designed to carry power supply currents to the electronic circuits lying at their intersections as illustrated in FIGS. 8a and 8b. In FIG. 8a, the circuit G(n,m) receives its voltage supply from probe-line Pn and its power return connection (or ground) from the sense line Sm. An array of 100 probe-lines and 100 sense-lines such as Pn and Sm on an IC could meausre the power supply currents of 10,000 circuits on the IC. By measuring the current flowing through the circuit at location Pn,Sm one can easily determine whether the circuit is ON or OFF as well as the amplitude of its output signal. The main advantage of such a scheme is that by measuring the current levels in the ON and the OFF states the noise margin and the switching speed of the circuit can be readily determined, in addition to the usual functional testing of the circuits. Further, by the appropriate choice of the power supply voltages one can force a desired signal level on the output of the circuits, thus providing a control over the signal levels being fed to other circuits under test.

The test structure in FIG. 8b illustrates a hybrid technique where the probe-lines are used to control switching devices in series with the sense-lines, however, the sense-lines are so attached that they can be used as power supply lines to measure the supply current flowing in to the circuit under test. This is accomplished by raising the sense-line voltage above the nominal supply voltage Vdd. When this occurs the diode 68 shuts off and all the power supply current through the circuit must flow from the sense-line.

The different probe and sense lines that provide the same voltages to different circuits on the IC under test in FIGS. 8a and 8b, can be shorted together during the normal use of the IC to minimize the number of chip connectors required to power the IC. This can be achieved by various means such as electronic switches, further processing of the IC to add a shorting metal level to the IC or by providing shorting means external to the IC such as the package containing the IC.

Figure 9A:
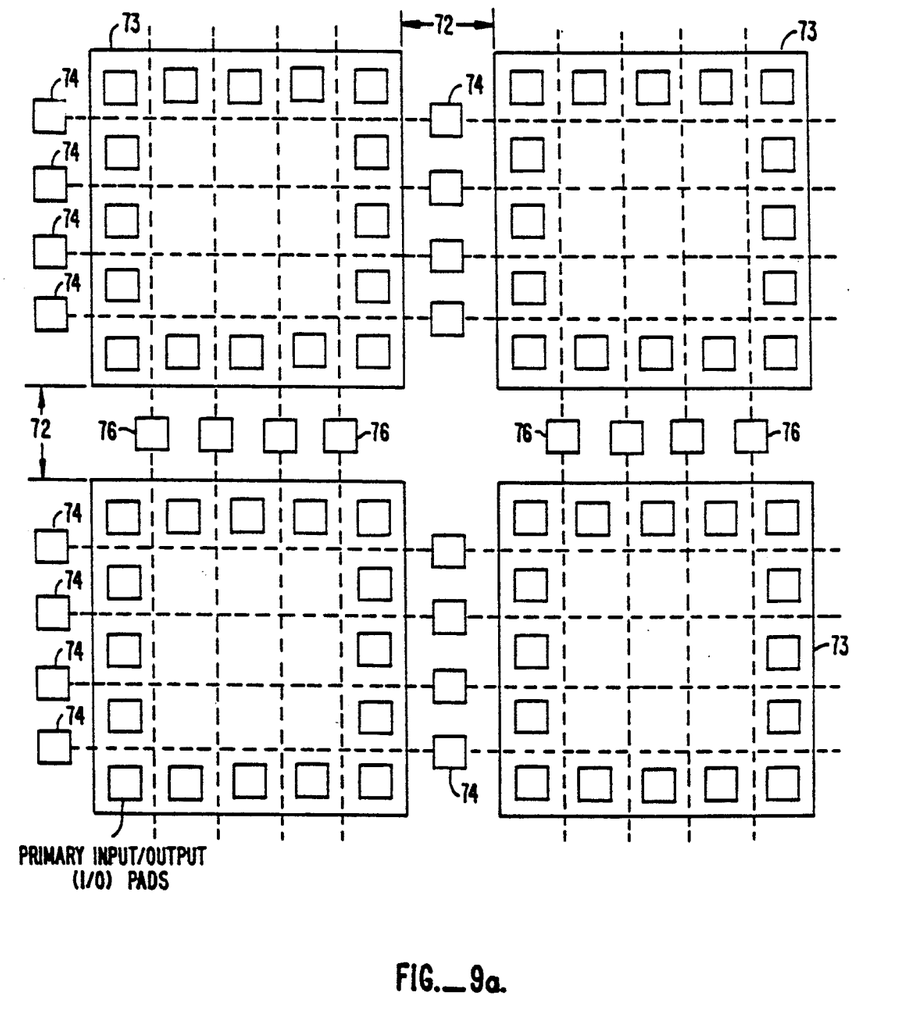
FIG. 9a shows a specific arrangement of Integrated Circuits on a section of a semiconductor wafer where the so-called kerf area surrounding the ICs is used to place the probe-points for the probe-lines and sense-lines. (The kerf area is where the wafer is sawed to separate the individual ICs from the wafer).
Figure 9B:
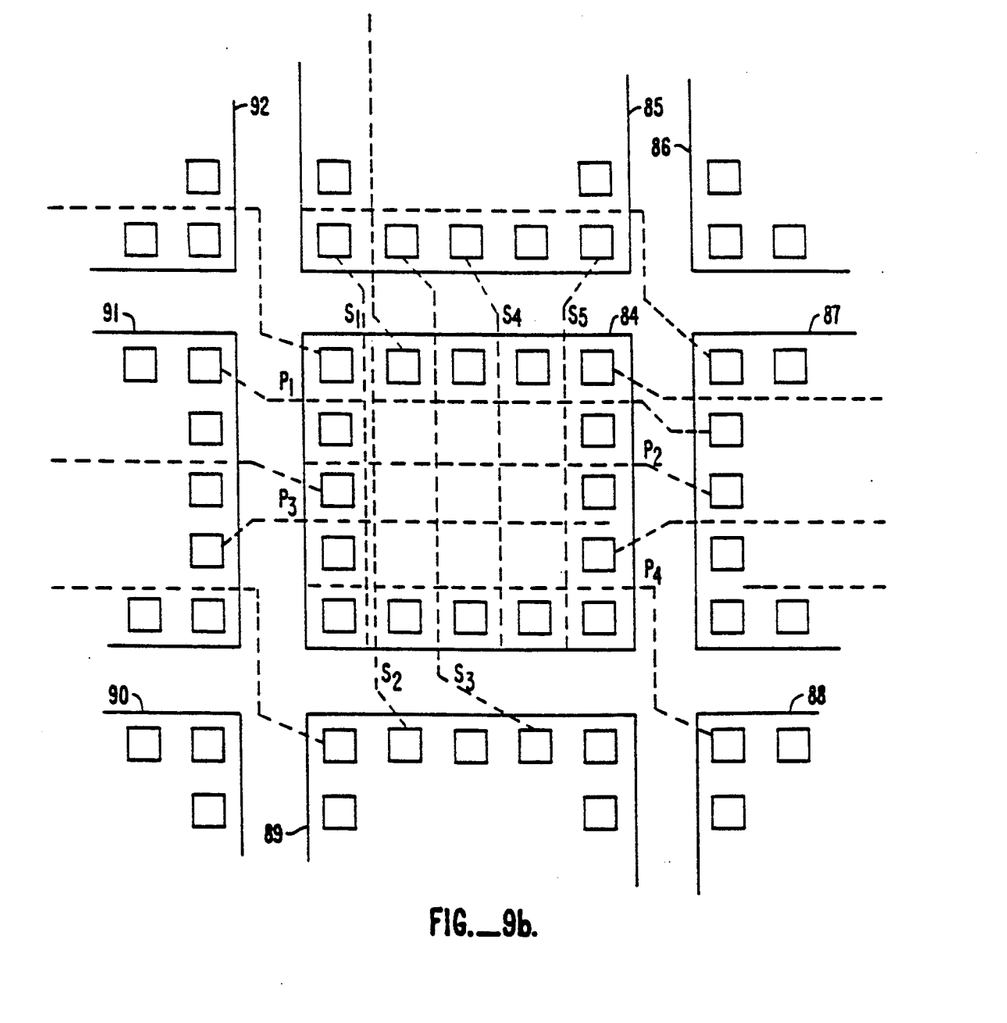
FIG. 9b illustrates a scheme where the primary signal input and output (I/O) points of ICs adjacent to and on the same semiconductor wafer as the IC being tested are used as the probe-points for the probe-lines and sense-line on the IC under test.

Some specific test structures are shown in FIGS. 9a and 9b which take advantage of the existance of many ICs on a semiconductor wafer to minimize the area occupied the probe-points. In FIG. 9a, the usually unused area bordering and lying between the IC 73, the so-called kerf area 72, is used to place probe-points 74 and 76 for the probe and the sense-lines respectively. Generally, the kerf area 72 between the ICs 73 is left unused to allow room for the wafers to be sawed into individual dies. Since the wafer level testing takes place before the wafer is sawed, this area can be used to place probe-points for the probe and the sense-lines and hence save valuable area on an IC.

In the test structure illustrated in FIG. 9b the primary Input/Output (I/O) pads of the adjacent ICs are shared between ICs during the "cross check" testing. When the IC 84 in the center of the figure, for example, is being tested the primary I/O pads of the other ICs, 85 through 92, are normally unused. In the test scheme shown in FIG. 9b, the probe-lines P1 through P4 and sense-lines S1 through S5 of IC 84 are connected to the primary I/O pads of the neighbouring ICs 85 through 92. Thus the primary I/O pads of ICs 85 through 92 can be used as the probe-points for testing IC 84. Similarly, when IC 85 is tested it utilizes the primary I/O pads of its neighbours, including IC 84, to probe its probe-lines and sense-lines. Thus, no additional probe-points are required to connect the probe or the sense-lines to the external test equipments, resulting in substanial area savings. The connections between the adjacent dies is automatically broken when the wafer is sawed after testing to separate the ICs.

The test structures described hereinabove may be fabricated in accordance with fabrication techniques well-known to those skilled in the art of semiconductor processing technologies such as deposition of metals and insulators by vacuum evaporation, sputtering and chemical vapor deposition means, doping of semiconductors by thermal diffusion or ion implantation techniques and the defination of patterns by photolithographic techniques. Since the fabrication techniques form no part of the present invention, it is believed that the foregoing description is sufficient for one skilled in the art to fabricate devices of the character described hereinabove.

The test structure described hereinabove provides means for increased access to the circuits within the IC for observing as well as controlling the signals at the test-points. Test techniques and instrumentation well-known to those skilled in the art of electronic IC testing need to be applied to the test structure described hereinabove to test the IC. Since the common test techniques and instrumentation form no part of the present invention, it is believed that the foregoing description of the test structure is sufficient for one skilled in the art of Integrated Circuit testing to achieve significantly enhanced testability of the IC using the structure described hereinabove.

While the invention has been particularly shown and described with reference to preferred embodiments thereof, it will be understood by those skilled in the art that the foregoing and other changes in the form and details may be made therein without departing from the spirit and the scope of the invention.

Having thus described my invention of the "cross-check" test structure, I claim as new and desire to secure by Letters Patent is:

1. A method for electrically testing an integrated circuit comprising arbitrary function combinatorial logic gates and an array of electronic switches connected to test-points on said integrated circuit, said electronic switches having access to test-electronics by means of probe-lines and sense-lines, said method comprising the steps of:

a. applying test patterns to said integrated circuit from test electronics;
   b. selectively applying ON signal levels to a selected one probe-line connected to a single row of an array of electronic switches, each electronic switch being a three-terminal memory-less electronic switch having a test terminal, a control terminal and a sense terminal, said test terminal being electrically connected to a first test-point at a logic signal-generating node of one of said arbitrary function combinatorial logic gates in said integrated circuit, said sense terminal being connected to one of said sense-lines, and said control terminal being connected to one of said probe-lines;
   c. sensing individually through said sense-lines test signals by means of said test terminal of said electronic switch controlled by said selected one probe-line;
   d. individually measuring with said test electronics said test signals present on selected said sense-lines;
   e. repeating steps b. through d. for selected rows of said array of said electronic switches; and
   f. repeating steps a. through e. while applying further test patterns to said integrated circuit until said integrated circuit has been tested.

2. A method for electrically testing an integrated circuit comprising arbitrary function combinatorial logic gates and an array of electronic switches connected to test-points on said integrated circuit, said electronic switches having access to test-electronics by means of probe-lines and sense-lines, said method comprising the steps of:

a. applying test patterns to said integrated circuit from test electronics;
   b. selectively applying ON signal levels to a selected one probe-line connected to a single row of an array of electronic switches, each electronic switch having a test terminal, a control terminal and a sense terminal, wherein said electronic switch comprises a Field Effect Transistor (FET) having as said control terminal a gate electrode, as said test terminal a first one of a source electrode and a drain electrode, and as said sense terminal a second one of said source electrode and said drain electrode, said test terminal being electrically connected to a first test-point at a logic signal-generating node of one of said arbitrary function combinatorial logic gates in said integrated circuit, said sense terminal being connected to one of said sense-lines, and said control terminal being connected to one of said probe-lines;

c. sensing individually through said sense-lines test signals by means of said test terminal of said electronic switch controlled by said selected one probe-line;

d. individually measuring with said test electronics said test signals present on selected said senselines;

e. repeating steps b. through d. for selected rows of said array of said electronic switches; and f. repeating steps a. through e. while applying further test patterns to said integrated circuit until said integrated circuit has been tested.

3. The method according to claim 2 wherein said gate electrode is coupled to said probe line, and a first one of said source electrode and said drain electrode is connected to one of said sense-lines and a second one of said source electrode and said drain electrode is connected to said test-point, such that said gate electrode is never connected to a test-point.